United States Patent [19]
Freund et al.

[11] Patent Number: 5,899,730
[45] Date of Patent: May 4, 1999

[54] METHOD OF HANDLING SEMICONDUCTOR WAFERS, BARS AND CHIPS

[75] Inventors: Joseph Michael Freund, Fogelsville; George John Przybylek, Douglassville; Dennis Mark Romero, Allentown; John William Stayt, Jr., Schnecksville, all of Pa.

[73] Assignee: Lucent Technologies Inc., Murray Hill, N.J.

[21] Appl. No.: 08/970,982

[22] Filed: Nov. 14, 1997

[51] Int. Cl.⁶ .................................................. H01L 21/301
[52] U.S. Cl. .......................... 438/464; 438/460; 438/465
[58] Field of Search .................................. 438/460, 461, 438/462, 463, 464, 465

[56] References Cited

U.S. PATENT DOCUMENTS

| | | |
|---|---|---|
| 4,688,075 | 8/1987 | Phy ........................................ 438/464 |
| 5,288,663 | 2/1994 | Ueki ....................................... 438/464 |
| 5,358,590 | 10/1994 | Yamanaka .............................. 438/464 |
| 5,362,681 | 11/1994 | Roberts, Jr. et al. ................... 438/464 |
| 5,411,921 | 5/1995 | Negoro ................................... 438/464 |
| 5,451,549 | 9/1995 | Oki et al. ............................... 438/460 |
| 5,534,102 | 7/1996 | Kadono et al. ......................... 438/464 |
| 5,622,900 | 4/1997 | Smith ..................................... 438/464 |
| 5,705,016 | 1/1998 | Senoo et al. ............................ 438/464 |
| 5,710,065 | 1/1998 | Alfaro .................................... 438/464 |
| 5,759,874 | 6/1998 | Okawa ................................... 438/126 |

*Primary Examiner*—Kevin M. Picardat
*Attorney, Agent, or Firm*—Lester H Birnbaum

[57] ABSTRACT

The invention is a method for handling material which may be in the form of semiconductor wafers, bars, and/or chips. The material is mounted to a flexible film which is heated so as to result in an adhesion strength sufficient to hold the material in place, but low enough so that the material can be removed easily when desired.

9 Claims, 2 Drawing Sheets

METHOD OF HANDLING SEMICONDUCTOR WAFERS, BARS AND CHIPS

FIELD OF THE INVENTION

This invention relates to device fabrication, and in particular for handling semiconductor material in the form of wafers, bars, and/or chips.

BACKGROUND OF THE INVENTION

In the fabrication of semiconductor components, for example laser chips, handling of the material during various phases of the fabrication can become critical due to the possibility of damage to the material. Usually, the semiconductor material is in the form of a wafer including a two dimensional array of devices, and the wafer is cut up into bars including a row of devices and finally into chips comprising individual devices. This cutting up of the wafer can be done by any of a number of cleaving, scribing and/or breaking methods known in the art.

In a typical process, the wafer is held in place by mounting to a tape during the cleaving operation. A problem arises in attempting to remove the resulting bars or chips for further processing. Since the adhesive strength of the tape is high, the bars or chips are removed by inserting a sharp blade between the tape and the surfaces of the bars or chips. This can cause damage to the devices included within the bars or chips.

It is desirable, therefore, to provide a method whereby the material can be held in place during certain processing, and then easily removed without a significant amount of damage to devices included in the material.

SUMMARY OF THE INVENTION

The invention is a method of handling material, which can be in the form of semiconductor wafers, bars, or chips. A flexible film is heated to a temperature which results in adhesion strength no greater than 1 g/mm$^2$. The material is mounted on a surface of the film so that the material adheres to the film during subsequent processing.

BRIEF DESCRIPTION OF THE FIGURES

These and other features of the invention are delineated in detail in the following description. In the drawing.

It will be appreciated, that, for purposes of illustration, these figures are not necessarily drawn to scale.

DETAILED DESCRIPTION

Figure 1:
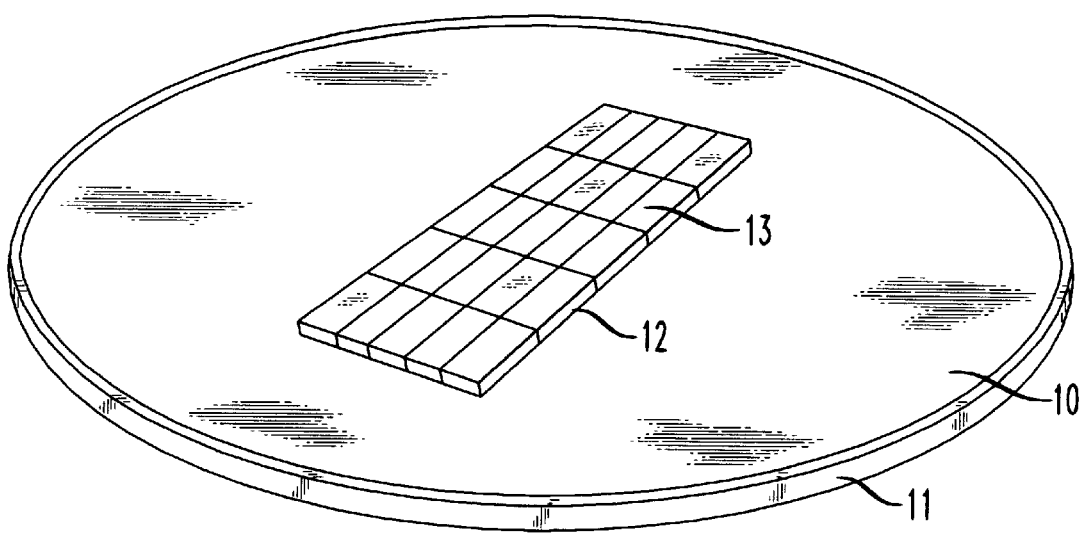
FIG. 1 is a perspective view of apparatus for semiconductor device fabrication during one stage in accordance with an embodiment of the invention.

The invention will now be described in further detail with reference to the figures in which like components are similarly numbered. As illustrated in FIG. 1, a thin, flexible film, 10, is stretched over a rim, 11. In this example, the rim, 11, is circular, but other shapes are possible. The film, 10, for semiconductor fabrication, is preferably polyvinyl chloride with a thickness within the range 0.051 mm to 0.127 mm (2 mils to 5 mils) for the reasons discussed below. This range can vary for other devices to be fabricated. In general, the thickness range may be 0.01–1.0 mm.

Figure 4:
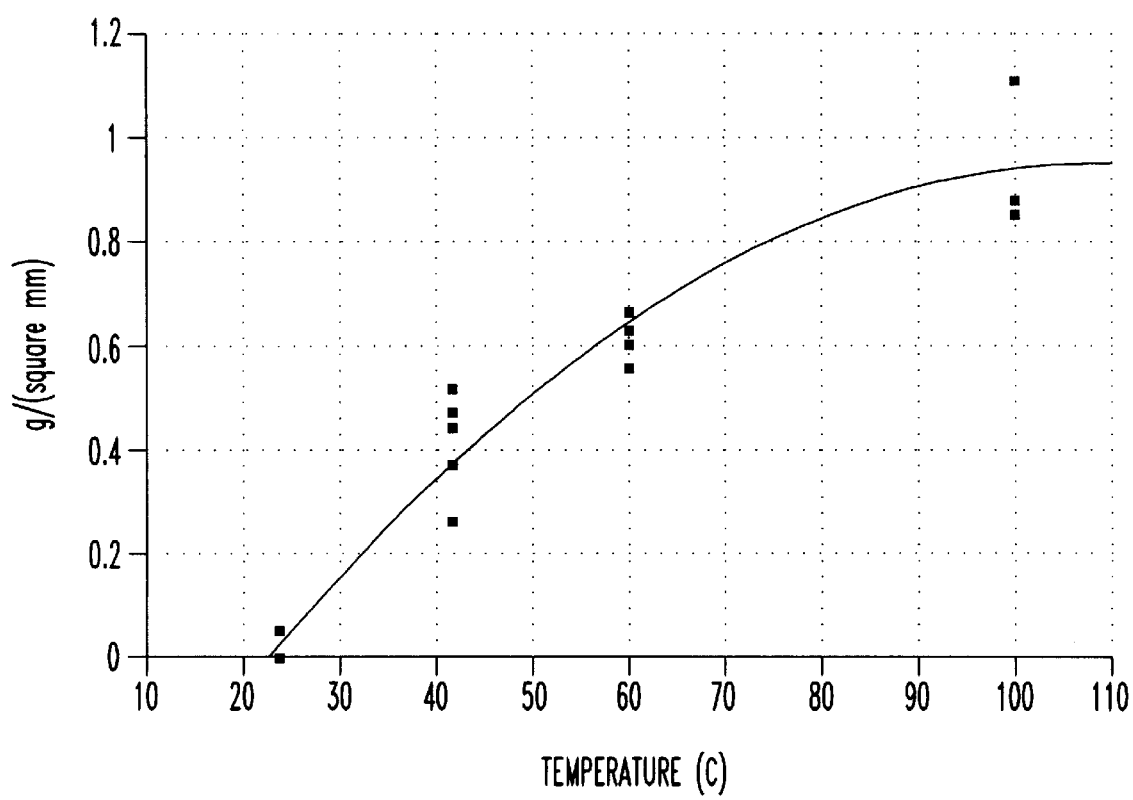
FIG. 4 is a graph of adhesion strength as a function of temperature for a film which is part of the apparatus of FIGS. 1-3.

The film, 11, initially has an adhesion strength of approximately zero. However, heating the film at a temperature within the range 25 to 100 deg C. for a time of 1 to 60 secs causes an increase in adhesion strength to within the range 0.1 to 1 g/mm$^2$ as illustrated in the graph of FIG. 4, which adhesion is maintained after the heating step. It was discovered that this range of adhesion strength was particularly desirable for semiconductor fabrication since it would hold the material and still allow easy removal without significant damage. Also, the film leaves no contamination on piece parts up to a temperature of 100 deg. C.

Thus, for example, a semiconductor wafer, 12, was placed on the major surface of the film before, during or after heating. In this example, the semiconductor material was InP with metal contacts and included an array of devices, e.g., 13, formed therein, whose boundaries are represented by the vertical and horizontal lines. Material selection is not limited to InP, and other semiconductor materials also adhere to the film. These devices, when separated, would ultimately constitute laser chips. Of course, the method can be used to form other types of semiconductor devices and integrated circuits.

Figure 2:
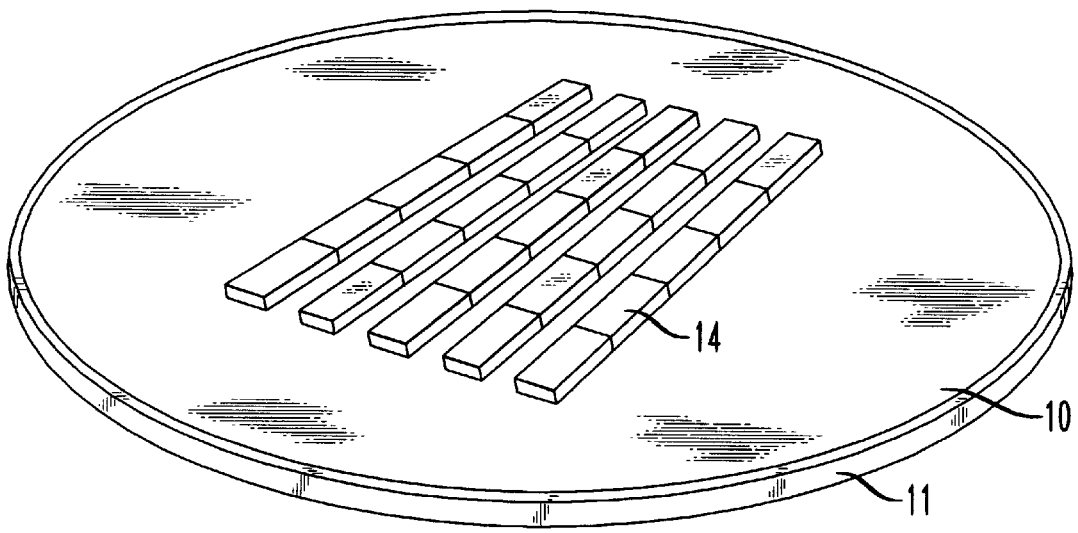
FIG. 2 perspective view of the apparatus during a different stage in accordance with the same embodiment.

As illustrated in FIG. 2, the wafer was initially separated into bars, 14, each including a row or column of the devices, e.g., 13. This separation was performed by standard cleaving techniques. It will be noted that due to the adhesion of the semiconductor material to the film, 10, the bars maintain essentially the same alignment as when they were part of the wafer, 12. This alignment is advantageous for automated handling systems since less time is required to align vision systems, and the alignment also permits testing particular piece parts.

Figure 3:
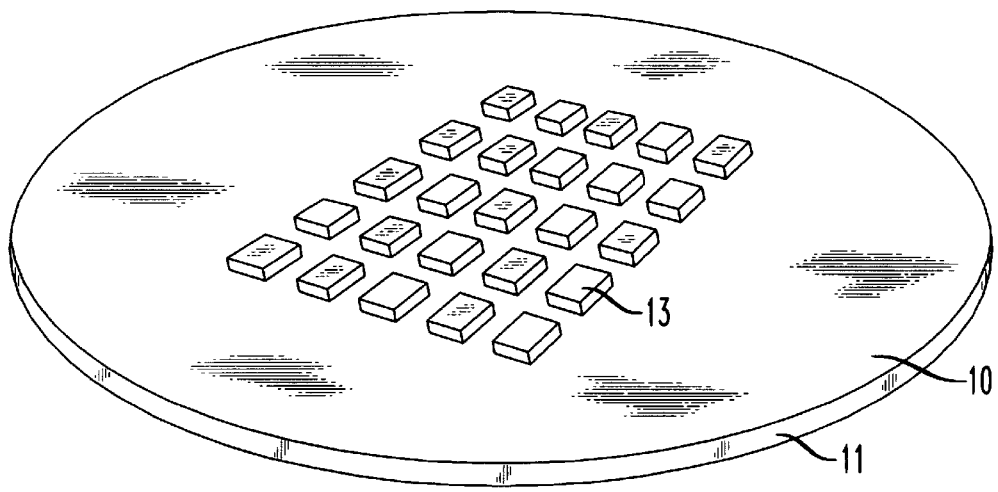
FIG. 3 is perspective view of the apparatus during a subsequent stage in accordance with the same embodiment.

As further illustrated in FIG. 3, the bars, e.g., 14, were again cleaved to form the separate chips, e.g., 13. Again, the chips maintained their basic alignment.

Subsequent to either cleaving operation, it is desirable to remove the bars or chips from the film, 10, for further processing. This operation can be done easily since the adhesion strength of the film is selected to be lower than the tapes usually used in the prior art, and the film is sufficiently thin to allow flexing to aid in the removal. Thus, for example, the film could be flexed by passing an object in contact with the top or bottom surface of the film to break the adhesion between the film and the piece parts.

It will be noted that one of the advantages of the invention is that the adhesion strength can be selected according to the temperature, and held at that value when the source of heat is removed. Thus, for example, a lesser adhesion strength may be selected for the bars and chips, typically 0.1 to 0.4 g/mm$^2$ than for the wafers, typically 0.2–1.0 mg/mm$^2$ by selecting a different film and temperature according to FIG. 4. Any standard form of heating can be employed. For example, a hot plate (not shown) heated by a resistive heater could be placed into contact with the bottom surface of the film before, during, or after mounting of the piece parts.

While the invention has been described in terms of semiconductor device fabrication, it will be appreciated that the invention is applicable whenever it is desired to keep a material in place during a particular operation, and then easily remove the material.

What is claimed is:

1. A method of handling material comprising:

heating a flexible film to a temperature which results in an adhesion strength no greater than 1 g/mm$^2$; and mounting the material to a major surface of the film so that the material adheres to the film during subsequent processing of the material.

2. The method according to claim 1 wherein the film comprises polyvinyl chloride.

3. The method according to claim 1 wherein the thickness of the film is within the range 0.01 mm to 1.0mm.

4. The method according to claim 1 wherein the film is heated to a temperature within the range 25 to 100 deg C.

5. The method according to claim 1 wherein the material comprises a semiconductor wafer including an array of devices formed therein.

6. The method according to claim 5 wherein the processing comprises cleaving the wafer into bars, each including a linear array of such devices.

7. The method according to claim 6 wherein the processing further comprises cleaving the bars into chips, each including a single one of such devices.

8. The method according to claim 1 further comprising the step of removing the material from the film.

9. The method according to claim 8 wherein the material is removed by flexing the film.

* * * * *